United States Patent [19]

Reinhardt

[11] 4,118,665
[45] Oct. 3, 1978

[54] TIME DOMAIN PHASE MEASURING APPARATUS

[75] Inventor: Victor S. Reinhardt, Gaithersburg, Md.

[73] Assignee: The United States of America as represented by the Administrator of the National Aeronautics and Space Administration, Washington, D.C.

[21] Appl. No.: 858,764

[22] Filed: Dec. 8, 1977

[51] Int. Cl.² ........................................... G01R 27/00
[52] U.S. Cl. ............................... 324/57 R; 324/83 D; 324/85; 328/163
[58] Field of Search ................ 324/57 R, 57 N, 83 D, 324/83 Q, 85; 328/133, 155, 163

[56] References Cited

U.S. PATENT DOCUMENTS

| | | | |
|---|---|---|---|
| 3,388,326 | 6/1968 | Brooks | 324/57 R |
| 3,419,799 | 12/1968 | Papadeas | 324/57 R |
| 3,675,136 | 7/1972 | O'Brien | 328/133 |
| 3,980,948 | 9/1976 | Olive | 324/83 D |
| 4,011,503 | 3/1977 | Ferrara | 324/83 D X |

*Primary Examiner*—Stanley T. Krawczewicz

*Attorney, Agent, or Firm*—Ronald F. Sandler; John R. Manning; John O. Tresansky

[57] ABSTRACT

The phase and/or period stability of a device being tested is determined by connecting the device in one orthogonal arm of a phase detector having a mixer. In the other arm is an adjustable, variable phase shift device, such as a line stretcher. The output of the mixer is fed through an active low pass filter to derive a DC voltage indicative of the phase shift of the tested device. Initially, the variable phase device is adjusted so that the DC voltage is approximately zero to nullify the phase shift of the tested device under normal conditions. The DC voltage level is converted into a time interval indicative of the phase change of the tested device by determining when the level equals the amplitude of a low frequency ramp voltage that functions similar to a beat frequency output of a prior art dual mixer detector. The interval between adjacent equality points for the phase indicating voltage and the ramp voltage can be measured or the period between a reference point on the ramp voltage and the equality between the ramp voltage and the phase indicating voltage can be measured.

16 Claims, 2 Drawing Figures

TIME DOMAIN PHASE MEASURING APPARATUS

ORIGIN OF THE INVENTION

The invention described herein was made by employees of the United States Government and may be manufactured and used by or for the Government for governmental purposes without the payment of any royalties thereon or therefor.

BACKGROUND OF THE INVENTION

The present invention relates generally to apparatus for deriving time domain measurements of the phase stability of a device being tested, and more particularly to such an apparatus wherein the amplitude of a DC signal indicative of the phase shift introduced by the tested device is compared with the amplitude of a ramp voltage.

Electrical and electronic devices, as well as other devices, introduce phase shift on signals that are coupled through them. The amount of phase shift is not stable within the same device, and there is a drift in phase shift as a function of ambient conditions, such as temperature, power supply voltage, etc. The phase shift instability is frequently referred to as phase noise, and in many types of equipment, it is a parameter that must be or is desirably ascertained. The phase noise can be measured either as a function of time shift (e.g., as a fraction of a second) or phase shift as measured in degrees or radians. Measuring time shifts has the advantage of providing an absolute indication that is not a function of the frequency of an AC source that is applied to the device being tested, either under test conditions or operating conditions.

Ideally, equipment to measure phase noise should not contribute any noise to the signal being monitored. Practically, this means that the elements of the equipment should introduce negligible phase noise compared to the phase noise of a reference oscillator driving the test device. To insure the introduction of negligible phase noise, it is necessary to measure phase noise with a resolution greater than that available from the best reference oscillators. This implies that one must employ a phase measurement technique which cancels out phase noise of the reference oscillator. In addition, it is desirable to utilize a system employing a minimum number of active elements because of the noise inherently introduced by such elements, particularly on analog signals.

A well-known, simple system which has been employed to measure phase noise, which introduces negligible phase noise compared to the phase noise of a reference oscillator, and is capable of measuring phase noise with a resolution greater than that available from reference oscillators, includes a phase detector having a pair of orthogonal channels that drive a mixer. In one of the channels, the device being tested is connected. The mixer derives a DC output voltage indicative of the phase shift introduced by the tested device, due to drift of the phase characteristics of the device. The DC voltage is applied by an amplifier to a noise analyzer, typically a lock-in amplifier. Because an RF source driving the two orthogonal channels is common to both channels, the phase noise of the RF source does not affect the output voltage of the mixer.

A problem occurs in attempting to apply this simple prior art system to time domain noise analysis. Time domain measures of phase stability, either as a function of time of the phase change with respect to a reference instant or time changes from one cycle to the next, require instantaneous measurement of the phase of a signal at periodic intevals. The instantaneous measurement is usually accomplished by superimposing the phase indicating signal amplitude on a low frequency beat and measuring the interval between adjacent cycles with a period counter and measuring the interval between a reference time and the phase time with a time interval counter.

To produce a beat with the previously described phase detector system, two reference oscillators have been employed. The use of two reference oscillators, however, reintroduces phase noise of the reference oscillators into the output voltage of the mixer so that the advantage of utilizing the phase detector including the mixer is obviated. To overcome this problem, it has been the practice to use a pair of two reference oscillator systems with a dual mixer phase comparator and to employ a time interval counter to measure the difference in the zero crossings of the resulting pair of beats. Although the dual mixer system works quite well, it requires double the circuitry of the simple, single phase detector system, in addition to requiring two reference oscillators, one of which must be offset in frequency from the other.

SUMMARY OF THE INVENTION

In accordance with the present invention, high resolution time domain phase stability measurements are obtained by utilizing a single phase detector driven by a single reference. The low frequency modulation which enables counters to be used to measure phase stability with high resolution in the time domain does not come from a beat between a pair of frequency displaced oscillators. Instead, the beat is derived from a low frequency ramp voltage which is linearly combined with the DC output of the phase detector. In effect, the ramp voltage and the DC, phase indicating output of the mixer are compared to derive pulses which are applied to a counter. The beat can be derived from a low frequency ramp because the beat provides a voltage to time conversion which enables a period of time interval counter to measure the voltage changes of the detector output which correspond to phase changes of the tested device. To derive measures of the period stability of the device being tested, the interval between adjacent pulses is determined with a counter. To determine the phase stability of the device being tested, the interval between a reference point on the ramp voltage and the instant when the comparison occurs is measured with a counter. To minimize the number of active elements, the same frequency source drives all of the phase detector, counter, and a passive, low pass filter from which the ramp voltage is derived.

It is, accordingly, an object of the present invention to provide a new and improved apparatus for deriving time domain measures of the phase and/or period stability of a device being tested.

Another object of the invention is to provide a new and improved apparatus employing a single reference frequency oscillator for deriving a time domain indication of the phase and/or period stability of a device being tested.

Another object of the invention is to provide a new and improved apparatus for deriving time domain measures of phase and/or period stability of a device being tested wherein phase noise is measured with a resolution greater than that available from the best reference oscillators, and wherein only a single oscillator need be employed.

A further object of the invention is to provide a new and improved apparatus for deriving time domain measures of the phase and/or frequency stability of a device being tested wherein a minimum number of active elements are employed so that the phase noise introduced by the measuring equipment is minimized.

The above and still further objects, features and advantages of the present invention will become apparent upon consideration of the followng detailed description of a specific embodiment thereof, especially when taken in conjunction with the accompanying drawing.

DETAILED DESCRIPTION OF THE PREFERRED EMBODIMENT

Figure 1:
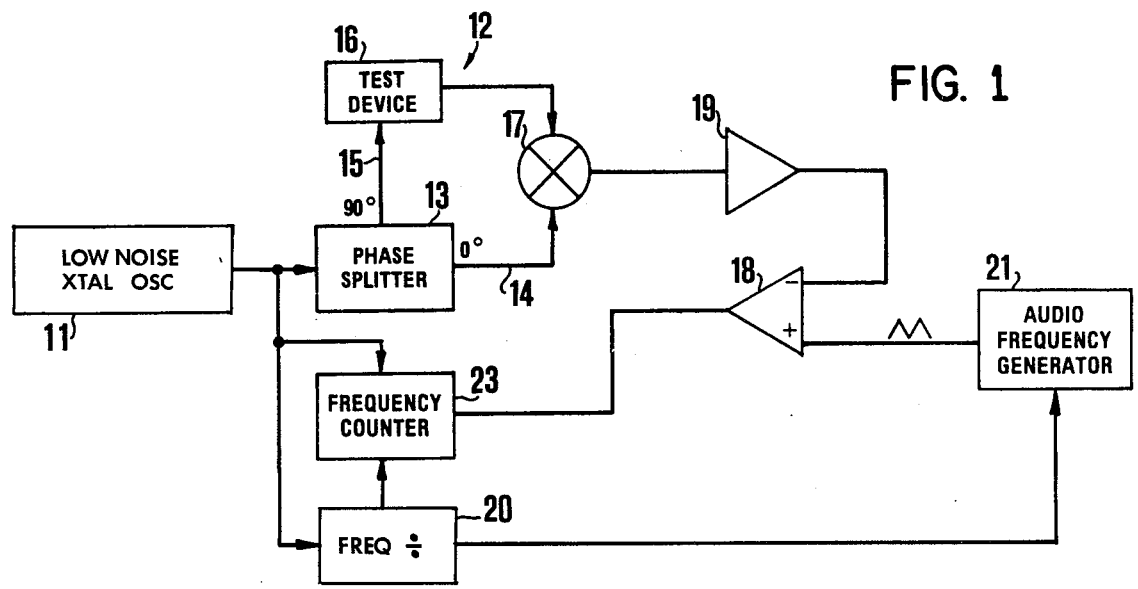
FIG. 1 is a block diagram of a system in accordance with the invention.

Reference is now made to FIG. 1 of the drawing wherein there is illustrated a 5 mHz, high quality, low noise crystal oscillator 11 that functions as a low noise frequency standard. The output of oscillator 11 is supplied to a phase detector 12 including a phase splitter 13 having orthogonal output channels 14 and 15. The signal in channel 15 is applied to device 16 that is being tested for time domain phase and/or period stability. The output signal of test device 16 is applied to one input of mixer 17, having a second input responsive to the signal in channel 14. Mixer 17 derives an output signal having a DC component with an amplitude indicative of the phase difference between the two inputs to the mixer; the DC component can be represented as sin $\Delta\Phi$, where $\Delta\Phi$ is the phase shift instability of test device 16.

Initially, variable phase shifting means (not shown in FIG. 1) in one or both of channels 14 and 15 is adjusted so that a zero DC component is derived from mixer 17 in response to the phase shift of device 16 under ambient conditions. To calibrate the relationship for a predetermined phase shift change of device 16 relative to the phase shift introduced by the device under ambient conditions, the variable phase shift means is incremented by a predetermined amount and the change in the DC component at the output of mixer 17 is noted, as described infra. Because only small changes of test device 16 are monitored to determine phase stability, it can be assumed that there is a linear relationship between the DC component change and the phase change, i.e., sin $\Delta\Phi \dot{=} \Delta\Phi$.

The DC component derived from mixer 17 is effectively compared with the amplitude of a beat, ramp voltage to which it is linearly added. To this end, the output of mixer 17 is supplied to an inverting input of analog adder 18 by an active low pass filter 19 having a gain on the order of 1000. The output voltage of amplifier 19, indicative of the DC component derived from mixer 17, is used to adjust the variable phase means included in phase detector 12 so that approximately zero output is derived from amplifier 19 under the initial conditions.

Amplifier 18 includes a non-inverting input responsive to a ramp, triangular waveform having a low frequency, such as 10 Hz, relative to the 5.0 mHz output of source 11. The phase of the triangular waveform is synchronized to the phase of time reference source 11, a result achieved by feeding the output of the time reference source through frequency divider 19 to triangular waveform generator 21, that preferably includes only passive elements to minimize noise in the system. The audio frequency output of generator 21 is effectively a beat for the DC output of amplifier 19, which beat is algebraically combined with the phase indicating output voltage of active low pass filter 19. Circuit 18 effectively compares the amplitudes of the outputs of low pass filter 19 and generator 21. When the outputs of filter 19 and generator 21 have a predetermined amplitude relationship, such as being equal, circuit 18 derives a pulse output, the occurrence time of which is indicative of the phase instability of device 16 being tested.

The pulse output of circuit 18 is utilized to determine the time domain phase or period instability of device 16. For both types of instability, the pulse output of circuit 18 is applied as a gating input to frequency couter 23 that is responsive to the 5 mHz output of oscillator 11 and indicates the number of cycles of the oscillator while the counter is gated on. For time domain phase stability measurements, counter 23 is gated on for an interval between a predetermined amplitude for the ramp voltage of generator 21 and the pulse output of circuit 18. To this end, a gate included in counter 23 is opened in response to the output pulse of circuit 18 and the gate is closed in response to the leading edge of the output frequency divider 20 which corresponds with the time when the ramp output of generator 21 has its average value. During the interval while the gate of counter 23 is open, pulses from oscillator 11 are coupled to a register of the counter, and the number of pulses counted during this interval is displayed as an indication of the delay time of device 16. To determine the time domain period stability of device 16, the time between adjacent pulses from circuit 18 is monitored by decoupling the output of frequency divider 20 to the input of counter 23, and adjusting the counter so that the gate included therein is opened and closed in response to adjacent occurrences of pulses from circuit 18.

The time domain phase instability measurement derived with counter 23 responsive to the outputs of circuit 18 and frequency divider 20 can be represented as:

$$x = K\Delta t,$$

where:
$K$ = a calibration factor representing the change in time interval counter reading for a predetermined phase change of the phase shift means of detector 12,
$\Delta t$ = the time interval measured by counter 23 between the outputs of circuit 18 and frequency divider 20, and
$x = (\Delta\Phi/2\pi f)$, where $\Delta\Phi$ = the phase change of the test device due to phase instability, and $f$ is the frequency of source 11.

The period instability of device 16 is indicated by counter 23 as:

$$y = K \times \Delta T/T,$$

where:
$\Delta T$ = the change in the period between adjacent output pulses of circuit 18, $T$ = the period of the waveform derived from generator 21, $y = (\delta f/f)$, where $\delta f$ is the change in frequency of test device 16 resulting from phase changes of the test device, and $f$ is the nominal frequency of source 11. Typically, in the system actually built, at the 5 mHz frequency of source 11, $K = 10^{-8}$, whereby a resolution of frequency counter 23 of $10^{-7}$ seconds yields a phase resolution $(x)$ of $10^{-15}$ seconds.

Figure 2:
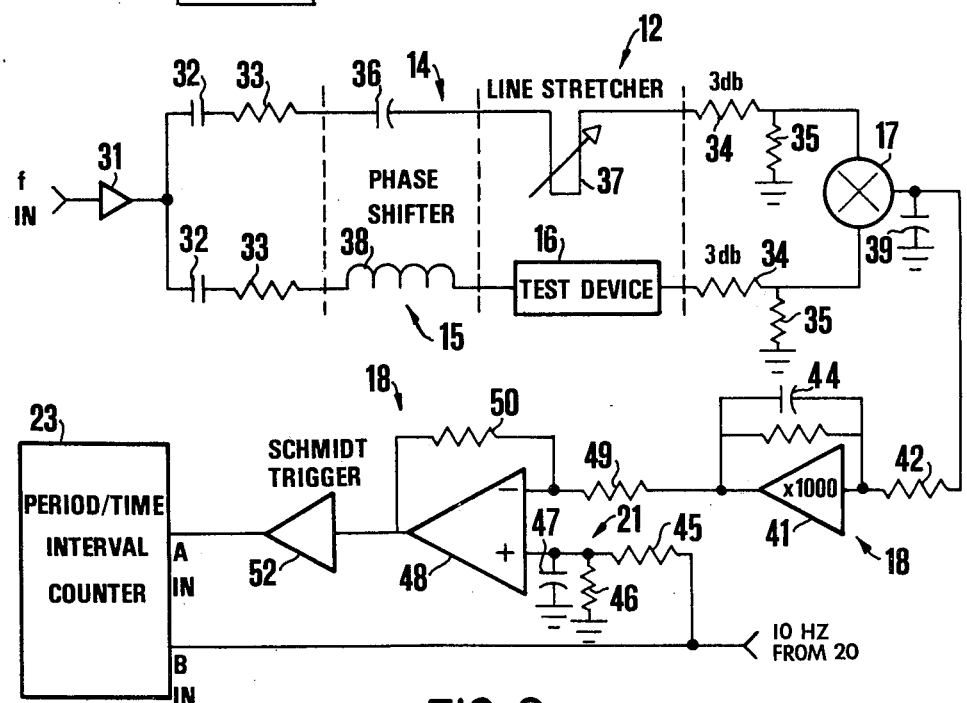
FIG. 2 is a partial block and partial circuit diagram of a preferred embodiment of the invention.

A specific circuit for implementing the block diagram of FIG. 1 is illustrated in FIG. 2, wherein phase detector 12 is illustrated as including orthogonal channels 14 and 15 driven in parallel by the 5 mHz output of source 11, as derived from amplifier 31.

Orthogonal channels 14 and 15 include identical input and output circuitry. In particular, each of the channels contains input circuitry including a blocking capacitor 32 that is series connected to a current limiting resistor 33. The output circuitry of each of channels 14 and 15 includes a 3 db attenuator containing series resistor 34 and shunt resistor 35. In channel 14 a high quality capacitor 36 and an air line stretcher 37 are series connected between resistors 33 and 34. Line stretcher 37 is a variable phase shift device that is used to assist in nullifying the initial phase shift of test device 16, as well as to introduce the calibration phase shift into the system. Channel 15 includes a high quality, low loss variable inductor 38 that is series connected with test device 16 between resistors 33 and 34 and assists in nullifying the initial phase shift of test device 16. In a preferred embodiment, capacitor 36 is a low temperature coefficient (NPO) type capacitor and inductor 18 includes a ferrite core.

The output signals of channels 14 and 15 are applied as inputs to mixer 17, having its output shunted by capacitor 39 so that high frequency components derived from the mixer are shunted to ground. The DC voltage developed across capacitor 39 is fed to active low pass filter 18 which includes an operational amplifier 41, as well as input and feedback resistors 42 and 43. Shunting feedback resistor 43 is a capacitor 44. Preferably, the values of components 42–44 are selected so that filter 18 has a gain of 1000 and a cut-off frequency of 16.7 Hz. Thereby, any possible 60 Hz interference in the circuit does not appear at the output of filter 18 and the low voltage DC output of mixer 17 is amplified to a suitable level for comparison with the ramp voltage.

Ramp source 21 is a passive integrator responsive to the square wave output of frequency divider 20. The passive integrator includes series resistor 45 and shunt resistor 46, that is in turn shunted by capacitor 47. The voltage developed across capacitor 47 is an approximateion, to a first degree, of a triangular wave. While the waveform developed across capacitor 47 is actually an exponential ramp, the exponential variation was found to be preferable to the alternative of a triangular wave generator including active elements which were found to introduce greater errors, due to noise, than were introduced by the exponential ramp.

The ramp voltage developed across capacitor 47 and the output of active low pass filter 18 are combined in an analog operational differential amplifier 48, that is a part of circuit 18. The ramp voltage developed across capacitor 47 is applied to the non-inverting input terminal of amplifier 48, while the output of filter 18 is applied to the inverting input of the amplifier through series input resistor 49. The gain and stability of operational amplifier 48 are controlled by negative feedback resistor 50 between the amplifier output and the inverting input of the amplifier. Amplifier 48 thereby derives an output that is linearly proportional to the difference between the voltages at the output of network 18 and developed across capacitor 47, whereby when the two inputs to amplifier 48 are equal, the amplifier derives a zero amplitude output.

The zero amplitude output of amplifier 48 is sensed by Schmidt trigger 52 which derives a short duration output pulse in response to the zero amplifude. Adjacent output pulses of Schmidt trigger 52 are applied to counter 23 to open and close gates included in the counter when the equipment is operated to indicate time domain measures of period stability. When counter 23 is operated to measure time domain phase stability, the output pulse of Schmidt trigger 52 opens a gate of counter 23, and the gate is subsequently closed in response to the trailing edge of the square wave output of frequency divider 20. In the preferred embodiment, counter 23 is a Hewlett Packard 5345 counter, having the stated internal gates.

The equipment described has a phase noise of approximately 0.02 picoseconds ($2 \times 10^{-14}$ seconds) for measurements made over an interval from 1.0 to 10.0 seconds. These results compare quite favorably with the prior art dual mixer, discussed in the Background of the Invention.

While there has been described and illustrated one specific embodiment of the invention, it will be clear that variations in the details of the embodiment specifically illustrated and described may be made without departing from the true spirit and scope of the invention as defined in the appended claims.

What is claimed is:

1. Apparatus for deriving time domain measures of phase and/or period stability of a device being tested comprising means responsive to a test signal applied to the device for deriving a DC signal component having an amplitude indicative of the phase shift introduced by the device, means responsive to the DC signal component for converting the amplitude of the DC signal component into a time interval indication, said converting means including means for combining the amplitude of the DC signal with the amplitude of a ramp waveform.

2. The apparatus of claim 1 wherein the DC signal component driving means includes a phase detector for deriving a zero amplitude signal in response to a predetermined phase shift being introduced by the tested device on a reference frequency source having a frequency much greater than the frequency of the ramp source, the predetermined amplitude relation being equality between the ramp waveform and the DC signal component.

3. The apparatus of claim 2 wherein the phase detector includes a pair of orthogonal channels responsive to the reference frequency source, one of said channels including the tested device, and a mixer for beating the signals propagating through the channels.

4. The apparatus of claim 2 wherein one of the channels includes a variable phase shift element for calibrating the phase detector with the tested device connected in the one channel.

5. The apparatus of claim 1 wherein the converting means includes a counter that is activated in response to the combined amplitudes of the DC signal component and the ramp waveform having a predetermined value.

6. The apparatus of claim 5 wherein the counter indicates the time interval between adjacent occurrences of the combined amplitudes having the predetermined value.

7. The apparatus of claim 5 wherein the counter indicates the time interval between the ramp waveform having a predetermined amplitude and the combined amplitudes having the predetermined value.

8. Apparatus for deriving time domain measures of phase and/or period stability of a device being tested comprising a time reference source; a phase detector responsive to the time reference source, said phase detector including: a pair of orthogonal channels driven by the time reference source, and a mixer responsive to the channels for deriving a DC signal component having an amplitude indicative of the phase difference of outputs of the two channels, one of the channels including the tested device, one of the channels including a variable phase shifter that is initially adjusted so that the DC signal component has approximately zero amplitude; means responsive to the time reference source for deriving a ramp waveform having a frequency much lower than the frequency of the time reference source, said ramp waveform deriving means including frequency divider means for deriving a pulse type waveform at the much lower frequency, and a passive low pass filter responsive to the pulse type waveform for deriving the ramp waveform; and means responsive to the ramp waveform and the DC signal component for converting the amplitude of the DC signal into a time interval indication.

9. The apparatus of claim 8 wherein the converting means includes a counter that is activated in response to the combined amplitudes of the DC signal component and the ramp waveform having a predetermined value.

10. The apparatus of claim 9 wherein the counter indicates the time interval between adjacent occurrences of the combined amplitudes having the predetermined value.

11. The apparatus of claim 9 wherein the counter indicates the time interval between the ramp waveform having a predetermined amplitude and the combined amplitudes having the predetermined value.

12. The apparatus of claim 8 wherein the converting means includes means for linearly combining the ramp waveform and the DC signal component to derive a linearly combined waveform, means for deriving a pulse in response to the linearly combined waveform having a predetermined amplitude, and a counter driven by the time reference source in response to pulses from the pulse deriving means so that the counter derives a count indicative of the number of cycles of the time reference source between one of the pulses and another event.

13. The apparatus of claim 12 wherein the another event is the adjacent occurrence of a pulse derived from the pulse deriving means.

14. The apparatus of claim 12 wherein the another event is indicative of the ramp waveform having a predetermined amplitude.

15. The apparatus of claim 8 wherein the converting means includes means for linearly combining the ramp waveform and the DC signal component to derive a linearly combined waveform, means responsive to the linearly combined waveform having a predetermined amplitude for deriving a pulse, and a counter driven by the time reference source in response to adjacent occurrences of pulses derived from the pulse deriving means.

16. The apparatus of claim 8 wherein the converting means includes means for linearly combining the ramp waveform and the DC signal component to derive a linearly combined waveform, means responsive to the linearly combined waveform having a predetermined amplitude for deriving a pulse, and a counter driven by the time reference source in response to pulses from the pulse deriving means and the pulse deriving means, so that the counter derives a count indicative of the number of cycles of the time reference source between a predetermined edge of the pulse type waveform and an adjacent pulse from the pulse deriving means.

* * * * *